United States Patent
Pierson et al.

(10) Patent No.: US 6,674,647 B2
(45) Date of Patent: Jan. 6, 2004

(54) LOW OR NO-FORCE BUMP FLATTENING STRUCTURE AND METHOD

(75) Inventors: Mark V. Pierson, Binghamton, NY (US); Ajit K. Trivedi, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/040,740

(22) Filed: Jan. 7, 2002

(65) Prior Publication Data

US 2003/0127499 A1 Jul. 10, 2003

(51) Int. Cl.[7] .............................. H05K 7/10; H01R 9/00; H01L 23/52
(52) U.S. Cl. ..................... 361/760; 361/772; 257/692; 257/738
(58) Field of Search ................................. 174/168, 524, 174/263; 361/760, 762, 767, 772, 808; 257/692, 738; 228/180.1, 180.22

(56) References Cited

U.S. PATENT DOCUMENTS

| | | | |
|---|---|---|---|
| 4,940,181 A | | 7/1990 | Juskey, Jr. et al. |
| 5,143,578 A | | 9/1992 | Luthi |
| 5,196,726 A | * | 3/1993 | Nishiguchi et al. ......... 257/737 |
| 5,272,307 A | | 12/1993 | Jones |
| 5,329,423 A | * | 7/1994 | Scholz ........................ 361/760 |
| 5,486,282 A | | 1/1996 | Datta et al. |
| 5,491,319 A | | 2/1996 | Economikos et al. |
| 5,525,065 A | * | 6/1996 | Sobhani ........................ 439/67 |
| 5,543,032 A | | 8/1996 | Datta et al. |
| 5,558,271 A | | 9/1996 | Rostoker et al. |
| 5,597,469 A | | 1/1997 | Carey et al. |
| 5,775,569 A | | 7/1998 | Berger et al. |
| 5,938,455 A | * | 8/1999 | Glovatsky et al. ............. 439/74 |
| 6,013,713 A | * | 1/2000 | Cotte et al. .................. 524/439 |
| 6,127,735 A | * | 10/2000 | Berger et al. ................ 257/778 |
| 6,146,912 A | * | 11/2000 | Tighe et al. ................... 438/15 |
| 6,281,105 B1 | * | 8/2001 | Cotte et al. ................. 438/612 |
| 6,355,504 B1 | * | 3/2002 | Jiang .......................... 438/118 |
| 6,365,842 B1 | * | 4/2002 | Jiang .......................... 174/261 |
| 6,485,843 B1 | * | 11/2002 | Eslamy ........................ 428/548 |
| 6,489,229 B1 | * | 12/2002 | Sheridan et al. ............. 438/614 |
| 6,525,413 B1 | * | 2/2003 | Cloud et al. ................. 257/686 |

* cited by examiner

*Primary Examiner*—M. Alexandra Elve
*Assistant Examiner*—Colleen P. Cooke
(74) *Attorney, Agent, or Firm*—McGuire Woods, LLP

(57) ABSTRACT

Self-aligning combination of a substrate with a chip is provided, using reverse patterns of raised recesses and raised shapes on the respective substrate and chip surfaces. High-force contact bump production is avoided. Reliable contact between a chip and substrate is achieved, with minimized skewing after chip placement.

5 Claims, 3 Drawing Sheets

LOW OR NO-FORCE BUMP FLATTENING STRUCTURE AND METHOD

FIELD OF THE INVENTION

The invention generally relates to semiconductor manufacturing, and more particularly, to placement of chips on substrates.

BACKGROUND OF THE INVENTION

In semiconductor manufacturing, methods have developed for attaching and connecting components of semiconductor devices. Certain conventional techniques have been developed for using solder bumps on a chip to connect the chip to a substrate. E.g., U.S. Pat. No. 4,940,181, in which multiple layered cavities are formed in the substrate for receiving solder bumps on a chip.

However, while some conventional procedures for connecting a chip to a substrate such as a laminate are known, those procedures are imperfect. For example, in a manufacturing context, components such as chips may skew after placement. Such skewing may be caused by using a flux that is not tacky enough to hold a chip well in position. Attempts to correct this holding problem involve formulating a tackier flux. However, a tackier flux may present other problems. Some problems associated with using flux are mentioned in U.S. Pat. No. 5,558,271 to Rostoker, for "Shaped, Self-Aligning Micro-Bump Structures" issued Sep. 24, 1996. Also, the lighter a chip is, the more difficulty that is presented in holding components after normal processing.

Some problems of current bump-flattening methods arise from the force per bump, e.g., the force associated with 5 mil-bump production is about 124 grams or about ¼ pound per bump, which may be sufficiently high stress to damage the laminate under the bump. The force can be applied, for example, by hammering or by static force. Conventional methods apply about 500–600 pounds of force on 2000 input/outputs (I/Os) on the laminate, which is a relatively substantial force, application of which can result in damage to devices produced by such methods. Such methods in which force is so applied are referred to herein as "contact" bump-forming methods.

Further problems arise from conventional production methods. Currently, eutectic solder (such as 63/37 solder) compatible with a circuit board is provided on a circuit board. A small volume of solder paste is stenciled or screened onto pads on a substrate, followed by a reflow, to produce domes, onto which a chip may be provided. From such a construction, contact often is insufficient, resulting in chip solder (such as C4) falling off or skewing before or during reflow resulting in solder electric shorting. Also, in conventional production, solder paste (which is tacky) is provided on pads, after which components in paste are provided and the components stick during reflow. However, such a method cannot be used with very small features, such as bumps on the order of 5 mils.

Commercial manufacturing currently balances all of these problems and other requirements for device attachment by contacting flat spots with tiny bumps. Such methods are highly dependent on the absence of jarring, and such movement can easily ruin the chip to substrate alignment. Thus, methods for contacting a chip and a substrate not suffering from the problems mentioned above have been sought, but chip-to-substrate contacting remains problematic.

SUMMARY OF THE INVENTION

By providing reverse patterns of raised shapes and recesses respectively on a chip and a substrate to be connected to each other, reliable contact between the chip and substrate may be achieved, with other advantages. Skewing after placement of a chip on a substrate is minimized by methods according to the invention. Advantageously, the relatively high forces associated with contact methods of bump production are avoided. The invention does not rely on flat bumps, and thus chip-to-substrate contact is not as subject to being jarred apart. Adhesive-containing flux is not needed, and thus problems associated with high solids flux can be avoided.

In order to accomplish these and other objects of the invention, the present invention in a preferred embodiment provides a self-aligning manufacturing method for combining a substrate with a chip, comprising: (A) on a substrate surface, providing a pattern; (B) on a chip surface, providing a reverse pattern to the patterned substrate, raised recesses and raised shapes being included in said pattern and said reverse pattern; (C) aligning the pattern and the reverse pattern. The invention also provides for combining the substrate and the chip. In a further surface mount technology (SMT) embodiment, the substrate and the chip are combined at a temperature of between about 50 to 150° C. Laser ablating may be used for forming recesses and/or for removing volume from raised shapes.

In another preferred embodiment, the invention provides electronic packages comprising a substrate contacting a chip through raised recesses counterpart to raised shapes.

The invention further includes (i) on the substrate providing a plurality of conductive pads, and on each pad providing a solder region to form a pattern of solder regions on the substrate; and (ii) on the chip, providing a plurality of solder chip contacts in a reverse pattern to the pattern of solder regions on the substrate. The pattern of solder regions on the substrate may be a pattern of solder regions, and the reverse pattern on the chip may be a pattern of solder bumps. The pattern of solder regions on the substrate may be a pattern of solder bumps, and the reverse pattern on the chip may be a pattern of raised solder recesses.

Further details of the inventive methods and products include the following. Raised recesses, raised shapes or a combination of raised recesses and raised shapes may protrude from the substrate. Raised recesses protruding from the substrate may comprise a plurality of conductive pads each having a recess therein. Raised shapes, raised recesses, or a combination of raised shapes and raised recesses may protrude from the chip. The invention also provides for the raised shapes and raised recesses to be personalized-fitting.

The inventive methods and products in a preferred embodiment include a softer solder (such as a high lead C4 solder) and a harder solder (such as a eutectic solder), wherein the softer solder is formed into the harder solder.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF THE PREFERRED EMBODIMENTS OF THE INVENTION

The invention exploits a "ball" and "socket" approach for connecting a chip with a substrate via reverse patterns of raised shapes and matching recesses. In one approach, the raised shapes may be patterned on the chip, with matching recesses provided on bumps on the substrate. In another approach, the raised shapes may be patterned on the substrate, with matching recesses provided in bumps on the chip. The raised shapes may be any raised shapes other than a flat surface, such as raised shapes that are domes, balls, bumps, cones and pyramids.

The reverse patterns may be any reverse-matched patterns that may be aligned, preferably that may be visually aligned, and most preferably that may be aligned by a placement machine. Reverse patterns may be those in which each respective pattern is either all raised shapes or all recesses, or in which a pattern comprises a mixture of raised shapes and recesses. Most preferable to use are reverse patterns in which each respective pattern is either all raised shapes or all recesses.

Combination of the respective reverse patterns may be at standard conditions for placing a chip on a substrate. Those skilled in the art are familiar with standard conditions of placing a chip on a substrate using minimal force. Reverse patterns according to the invention advantageously provide better holding between the chip and substrate than conventional methods for chip/substrate placement.

The dimensions of the raised shape and the recess are such that a pattern and a reverse pattern are established that may be matched in the xy plane. An exact fit between the raised shape and raised recess is not required in the z-axis, and a non-exact fit is expected. Preferably, raised shapes (or, respectively, raised recesses) in a pattern or reverse pattern are of the same general x,y,z dimensions. In the event that a raised shape is provided that is substantially higher volume than other raised shapes in its pattern, excess volume may be removed by laser ablation by an additional laser pulse or pulses. Laser-ablation may be used on those raised shapes for which shape-changing is desired. By measurement of the volume of the solder bump, concave surfaces desirably can be made more planar by adding or deleting laser pulses.

Figure 1A:
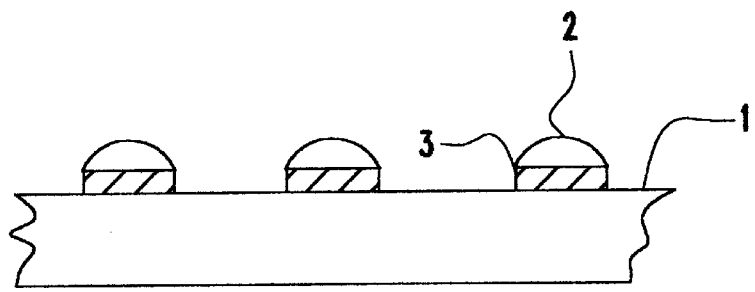
FIGS. 1(a), (b), (c) and (d) are cross-sectional views of making an electrical package according to the invention.

Exemplary reverse patterns according to the invention may be appreciated with reference to FIGS. 1(a)–(d). As FIG. 1(a) shows, onto a laminate 1, pads 3 are provided, followed by adding solder 2 which is reflowed to pads 3. Laminates, solders and pads are known to those skilled in the art. Preferably the solder 2 is any material that, after being lased-flat or made concave, may receive a "controlled chip collapse connection" (C4) solder. Advantageously, the invention thus provides force-free methods for forming the solder.

Figure 1B:
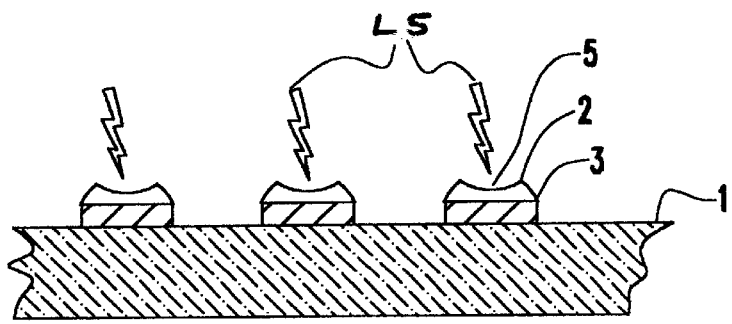

After the solder 2 has been reflowed to pads 3, as shown in FIG. 1(b) solder 2 is removed (such as by a laser source LS) from each bump to form a socket shape 5. Examples of a laser to use are a YAG or an excimer, with a YAG laser being preferable. Lasing may be accomplished, for example, by a YAG laser (such as an ESI 5200 laser system) at a wavelength of 355 nm, a frequency of 455 Hz, and a spot size of 3–4 mils for 5 pulses. The quantity of pulses may be determined based on the solder volume. Advantageously, the solder is relatively clean after lasing and the lased bump is uncontaminated. Optionally, the solder debris may be washed off.

Figure 4:
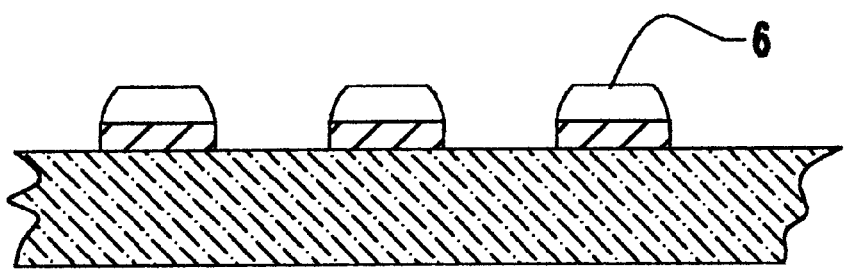
FIG. 4 is a cross-sectional view of an alternative intermediate in making an electrical package according to the invention.
Figure 3:
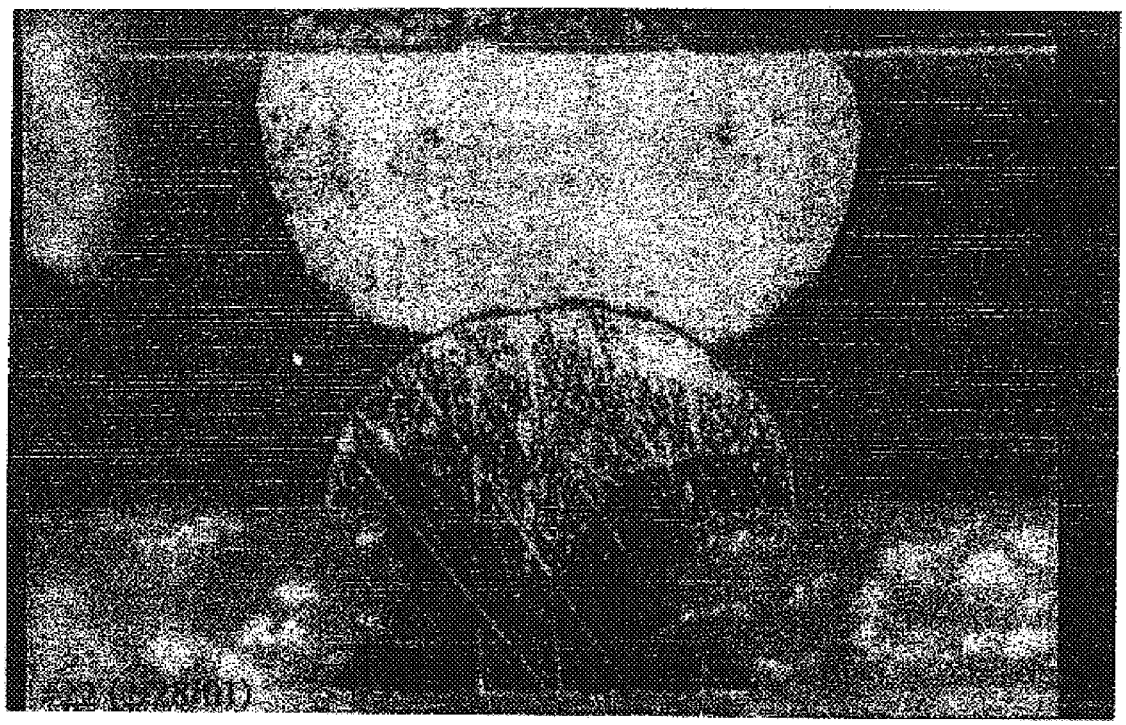
FIG. 3 is a photograph of microscopic detail of a part of an inventive device according to FIG. 2.

Alternately to FIG. 1(b) in which the bumps are lased into concave recesses, the bumps instead may be lased to provide lased-flat bumps 6 as shown in FIG. 4. For making the structure of FIG. 4, a laser with a Gaussian beam (such as a YAG laser) that provides more power at the top and less power at the edges may be used to provide the flat surface.

Figure 1C:
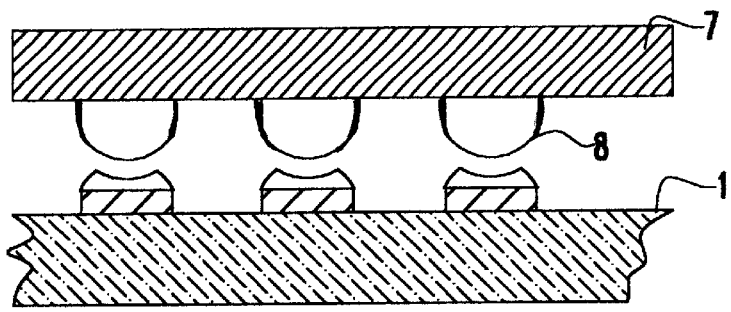

Returning to FIGS. 1(a) and 1(b), thus, by processing steps seen with reference to FIGS. 1(a) and (b), a substrate may be provided with a pattern of recesses combinable with a reverse pattern of raised shapes on a chip, such as chip 7 in FIG. 1(c). Chip 7 includes chip contacts 8 (such as C4 solder). The pattern of chip contacts 8 on chip 7 is a reverse pattern to the pattern of recessed surfaces 6 on the substrate 1. The chip 7 is attached to the substrate 1, by moving the chip contacts 8 into their mating bump sockets 9 in the recesses 6. Aligning of the mating bump sockets and bumps may be done visually, preferably by a placement machine. Those skilled in the art are familiar with placement techniques. Advantageously, methods of the invention may be self-aligning, with bump sockets 9 and solder 8 being interlocking. Preferably, chip placement on the substrate is such that the C4 is somewhat dented, which provides a holding-together feature not seen in conventional processes relying on flat surfaces. Also, the invention provides C4 to bump alignment and compensates for high and low solder volume on bumps.

Figure 1D:
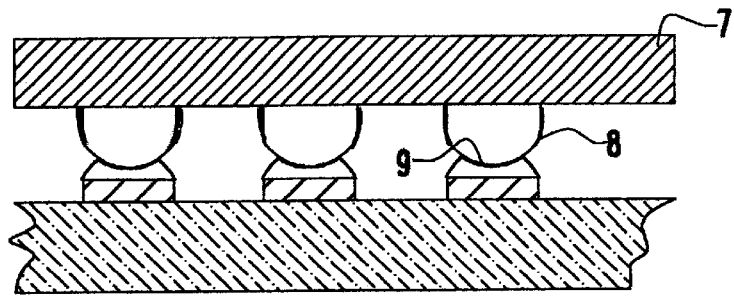

The self-aligned chip 7 and substrate 1 after combination are shown in FIG. 1(d). Advantageously, compared to conventional chip-on-substrate placement methods, sliding of the chip 7 after placement according to the invention is reduced.

It will be appreciated that FIGS. 1(a) through (d) depict reverse patterns in which the raised shapes are associated with the chip and the recesses are associated with the substrate. It will be appreciated that the invention also provides for associating a pattern of raised shapes with the substrate and a reverse pattern of recesses with a chip to be combined therewith. An exemplary reverse pattern according to this second embodiment of the invention is shown in FIG. 2.

Figure 2:
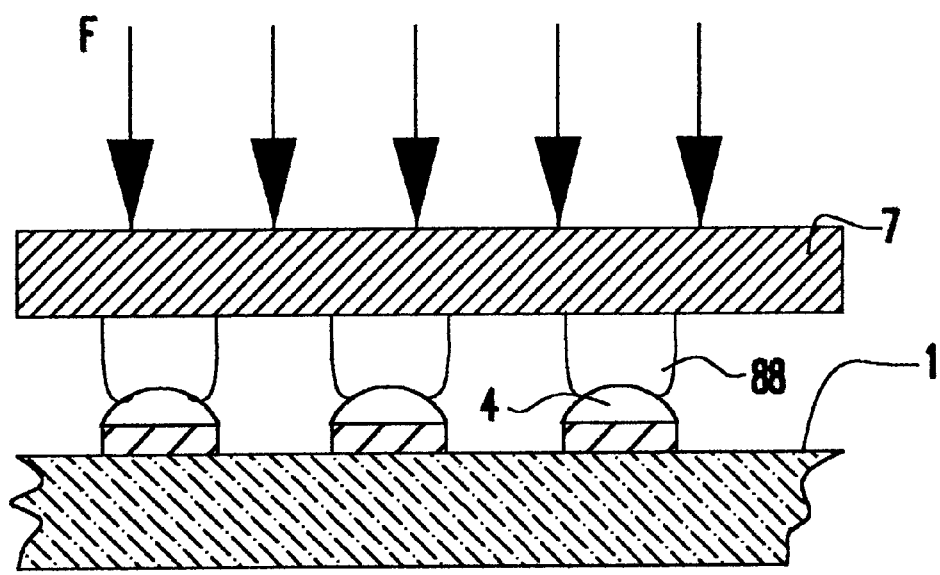
FIG. 2 is a cross-sectional view of an electrical package according to the invention.

As shown in FIG. 2, a substrate 1 (such as a laminate) is provided with eutectic solder raised shapes 4 (such as bumps). The chip 7 to be combined with the substrate 1 includes recessed solder regions 88 with each solder region having a recess at a free end. The pattern of recessed solder regions 88 is a reverse pattern to the pattern of raised shapes 4. The chip 7 is aligned and placed with a predetermined force F to form the structure shown in FIG. 2. The softer solder 88 (such as high lead C4 solder) forms around the harder solder 4 (such as eutectic solder). "Personalized" (i.e., best possible) fit is accomplished when soft solder is formed into the hard solder site. Lower force applications can be realized by elevating temperatures used during chip-to-substrate placement, such as temperatures above about 50° C. and below the melting temperature of the lowest-melt solder (183° C. in the case of 63/37 solder), preferably temperatures between about 50 and 150° C.

Thus, by the methods and products of the invention, advantageous contact of C4 to solder bump may be provided at each chip site. C4 to bump contact thus is maximized. With maximized C4 to bump contact, skew after placement advantageously can be minimized or avoided. Also, tacky flux formulation can be avoided.

While the invention has been described in terms of its preferred embodiments, those skilled in the art will recognize that the invention can be practiced with modification within the spirit and scope of the appended claims.

We claim:

1. An electronic package, comprising:

a first substrate;

a plurality of pads formed on the first substrate, each pad having a raised flat surface;

a plurality of first solders each formed on the raised surface of a corresponding one of the plurality of pads and having a top concave surface and a bottom flat surface covering the raised flat surface of the corresponding pad;

a second substrate facing the first substrate; and a plurality of a second solders formed on the second substrate corresponding to the plurality of first solders, each second solder having a convex top surface matching the concave surface of the corresponding first solder, wherein the plurality of first solders are softer than the plurality of second solders to allow each of the plurality of first solders to match with the convex top surface of each of the corresponding plurality of second solders such that a personalized fit is provided between each of the plurality of first and second solders.

2. The electronic package of claim 1, wherein the softer solder is a high lead C4 solder and the harder solder is a eutectic solder.

3. The electric package of claim 1, wherein the first substrate is a laminate and the second substrate is a chip.

4. The electric package of claim 3 wherein the first substrate is a chip and the second substrate is a laminate.

5. The electric package of claim 1, wherein the bottom flat surface of each of the plurality of first solders each entirely covers the raised flat surface of the corresponding pad.

* * * * *